United States Patent
Chen et al.

(10) Patent No.: US 6,214,653 B1
(45) Date of Patent: Apr. 10, 2001

(54) METHOD FOR FABRICATING COMPLEMENTARY METAL OXIDE SEMICONDUCTOR (CMOS) DEVICES ON A MIXED BULK AND SILICON-ON-INSULATOR (SOI) SUBSTRATE

(75) Inventors: Howard H. Chen, Yorktown Heights; Louis L. Hsu, Fishkill, both of NY (US); Li-Kong Wang, Mount Vale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/325,732

(22) Filed: Jun. 4, 1999

(51) Int. Cl.[7] .......................... H01L 21/00; H01L 21/84; H01L 21/20; H01L 21/76
(52) U.S. Cl. .................... 438/153; 438/150; 438/151; 438/152; 438/154; 438/478; 438/480; 438/404
(58) Field of Search ..................... 438/150, 151, 438/152, 153, 154, 478, 480, 404

(56) References Cited

U.S. PATENT DOCUMENTS

| | | | |
|---|---|---|---|
| 5,244,828 | * 9/1993 | Okada et al. | 437/81 |
| 5,258,318 | 11/1993 | Buti et al. | 438/154 |
| 5,373,803 | * 12/1994 | Noguchi et al. | 117/8 |
| 5,399,507 | * 3/1995 | Sun | 437/24 |
| 5,493,137 | 2/1996 | Satoh et al. | 257/296 |
| 5,508,219 | 4/1996 | Bronner et al. | 438/152 |
| 5,585,284 | 12/1996 | Park | 438/155 |
| 5,830,784 | * 11/1998 | Zhang et al. | 438/154 |
| 5,891,763 | * 4/1999 | Wanlass | 438/149 |
| 5,930,638 | * 7/1999 | Reedy et al. | 438/382 |
| 5,956,597 | * 9/1999 | Furukawa et al. | 438/405 |
| 6,015,745 | * 1/2000 | Adkisson et al. | 438/405 |

OTHER PUBLICATIONS

Neudeck, G., "A New Epitaxial Lateral Overgrowth Silicon Bipolar Transistor", IEEE Electron Device Letters, vol. EDL-8, No. 10, Oct. 1987, pp. 492–495.

Zingg, et al., "Three–Dimensional Stacked MOS Transistors by Localized Silicon Epitaxial Overgrowth", IEEE Transactions on Electron Devices, vol. 37, No. 6, Jun. 1990, pp. 1452–1461.

* cited by examiner

Primary Examiner—John F. Niebling
Assistant Examiner—Jennifer M. Kennedy
(74) Attorney, Agent, or Firm—McGinn & Gibb, PLLC; Marian Underweiser, Esq.

(57) ABSTRACT

A method of forming a semiconductor substrate (and the resulting structure), includes etching a groove into a bulk silicon substrate, forming a dielectric in the groove and planarizing the silicon substrate to form at least one patterned dielectric island in the silicon substrate, forming an amorphous silicon (or SiGe) layer on exposed portions of the silicon substrate and the at least one dielectric island, crystallizing the amorphous silicon (or SiGe) layer using the exposed silicon substrate as a seed, the silicon substrate having direct contact with the formed silicon layer serving as a crystal growth seeding for the crystallization process, and converting the silicon (or SiGe) layer to crystallized silicon, and performing a shallow trench isolation (STI) process, to form oxide isolations between devices.

23 Claims, 7 Drawing Sheets

METHOD FOR FABRICATING COMPLEMENTARY METAL OXIDE SEMICONDUCTOR (CMOS) DEVICES ON A MIXED BULK AND SILICON-ON-INSULATOR (SOI) SUBSTRATE

BACKGROUND OF THE INVENTION

1. Field of the Invention

The present invention generally relates to a method of forming a semiconductor device, and more particularly to a method of fabricating complementary metal oxide semiconductor (CMOS) devices on a mixed bulk and SOI substrate on the same chip.

2. Description of the Related Art

Using merged dynamic random access memory (DRAM) and logic technology to fabricate a system on a semiconductor chip (e.g., so-called "system-on-chip" (SOC)) has many advantages including reduction of memory latency, larger bandwidth, high-speed processing, and cost reduction.

For deep submicron CMOS logic devices, it is advantageous to build the circuits on silicon on insulator (SOI) substrate to improve the performance. However, due to the buried oxide structure and processing techniques used to form an SOI substrate, many devices cannot be built easily on the SOI substrate. For example, a large capacitor on SOI will have a difficult time making contact to the ground node. As another example, the deep trench capacitor DRAM devices, which are typically built on a bulk silicon substrate, are very difficult to integrate into the SOI substrate, as the merged DRAM/logic technology. That is, the deep trench capacitor DRAM typically cannot be built on the SOI because of the oxide barrier of the SOI which makes trench processing very complicated.

Thus, as the logic technology migrates to silicon-on-insulator (SOI) substrate technology, it becomes difficult to fabricate a DRAM that requires deep trench capacitor structures, or having a large-sized capacitor.

Additionally, thermal dissipation is poor for devices built on the conventional SOI substrate. High temperature will cause great performance degradation.

Moreover, if analog and digital devices are built on a single substrate (e.g., bulk), then high frequency noise (interference) results from the mixed signals. That is, there is no separation of noise-sensitive and noise-insensitive devices and thus the signals output therefrom are subject to interference.

SUMMARY OF THE INVENTION

In view of the foregoing and other problems of the conventional methods and structures, an object of the present invention is to provide a method for forming a mixed bulk and SOI structure.

Another object is to provide a method and structure in which complementary metal oxide semiconductor (CMOS) circuit is built strategically on a silicon-on-insulator (SOI) structure and bulk. For example, in an exemplary implementation, a high speed circuit can be built on the SOI substrate, and temperature-sensitive circuits can be fabricated on a bulk substrate. As another example, noise-sensitive circuits can be built on SOI region where the circuits are completely isolated by the oxide including the buried oxide layer, and noise-less or noise-insensitive circuits are built in the bulk structure.

Further, another object is to provide a process for merging silicon-on-insulator and bulk substrate technology on the same substrate so that the DRAM array with deep trench cells is formed on bulk and the logic device(s) is formed on SOI.

In a first aspect of the present invention, a method of forming a semiconductor device, includes patterning a groove into a bulk silicon substrate, forming an oxide in said groove and planarizing the silicon substrate to form at least one patterned oxide island in the silicon substrate, forming a silicon layer on exposed portions of the silicon substrate and the at least one oxide island, crystallizing the silicon layer using the exposed silicon substrate as a seed, the silicon substrate having direct contact with the formed silicon layer serving as a crystal growth seeding for the crystallization process, and converting the silicon layer to crystallized silicon, performing a shallow trench isolation (STI) process for device isolation as well as for removing defective regions after silicon crystallization to form the oxide isolations between devices, wherein a portion of the silicon layer above the islands is etched to form a cavity and then the same material as the islands is deposited in the cavity, and planarizing the upper surface to complete the oxide isolations. It is noted that an advantage of the present invention is that by performing the STI process also simultaneously removes the defective regions by filling the same with oxide.

In another aspect of the invention, a semiconductor device formed by the above method is provided.

Thus, according to the present invention, a method and structure are provided which produce a patterned SOI substrate where DRAM devices can be built on the bulk substrate while the logic devices (as well as the peripheral devices for the DRAM devices) are built on the patterned SOI substrate.

With the unique and unobvious features of the invention, memory circuits, for example, dynamic random access memory (DRAM) and logic technology, can be efficiently merged to fabricate an entire system on a semiconductor chip such that memory latency is reduced, bandwidth is increased, and high-speed processing and cost reduction result.

The present invention is also advantageous, for example, from a process point of view. Specifically, as compared to the conventional patterned SIMOX technique, which results in a much higher number of defect counts per unit area (or defect density), the method of the present invention results in a much better substrate quality. This higher substrate quality is because the stress from lattice mismatch (e.g., of the oxide and the silicon) is more by high energy oxygen implantation. The defective regions resulting from the method of the present invention are also predictable and therefore can be completely removed in a subsequent shallow trench formation.

BRIEF DESCRIPTION OF THE DRAWINGS

The foregoing and other purposes, aspects and advantages will be better understood from the following detailed description of preferred embodiments of the invention with reference to the drawings, in which:

FIGS. 1A–1E illustrate a first embodiment of the method of forming a semiconductor substrate according to the present invention;

DETAILED DESCRIPTION OF PREFERRED EMBODIMENTS OF THE INVENTION

Referring now to the drawings, and more particularly to FIGS. 1A–6B, there are shown preferred embodiments of the method and structures according to the present invention.

Generally, the invention is a method for forming a semiconductor device by forming a patterned "hybrid" substrate such that DRAM devices can be built on the bulk portion of the substrate, whereas logic devices (as well as the peripheral devices for the DRAM) can be built on the patterned SOI substrate. This demonstrates how a system-on-a-chip (SOC) can be easily and efficiently realized.

Referring now to FIGS. 1A–6B, a semiconductor device structure and a process of forming the semiconductor device will be described hereinbelow.

First Embodiment

FIGS. 1A–1D illustrate process of forming a substrate for mixed SOI and bulk applications according to a first embodiment of the present invention. Basically, this process shows how to form a local SOI structure in the bulk substrate including isolation and defect removal steps on the SOI silicon layer.

Figure 1A:
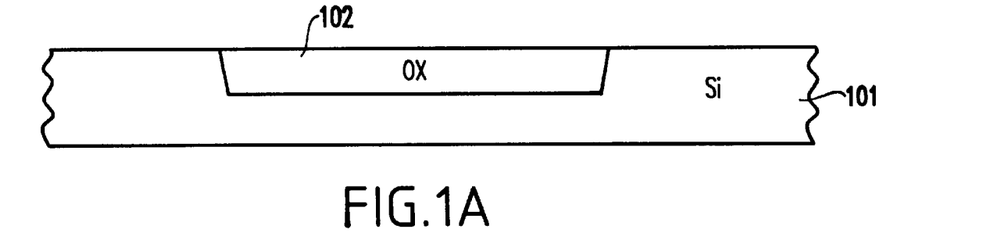

In FIG. 1A, a buried oxide layer 102 is processed (using the method described above) on a single crystal silicon substrate 101. Specifically, a shallow groove is formed in the silicon bulk substrate 101, and is filled with an oxide layer. Preferably, the groove has dimensions of about 2 $\mu$m to about 10 $\mu$m in width, and 1000 Å to 5000 Å in height/thickness.

Figure 1B:
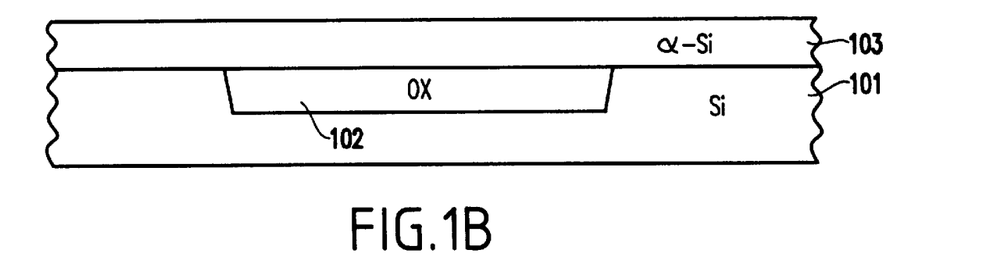

Thereafter, as shown in FIG. 1B, an amorphous silicon layer 103 is formed (e.g., deposited) over the oxide 102 and silicon layer 101.

Figure 1C:
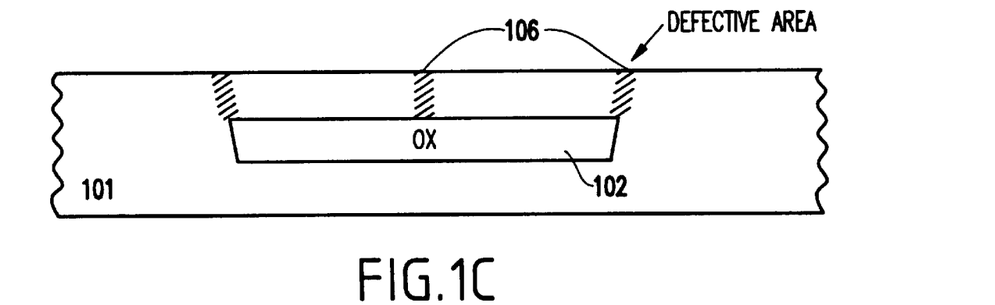

In FIG. 1C, a process is performed to crystalize the amorphous silicon layer using the single silicon crystal substrate as the seeding. Also shown areas in the crystallized layer where defects are formed.

Figure 1D:
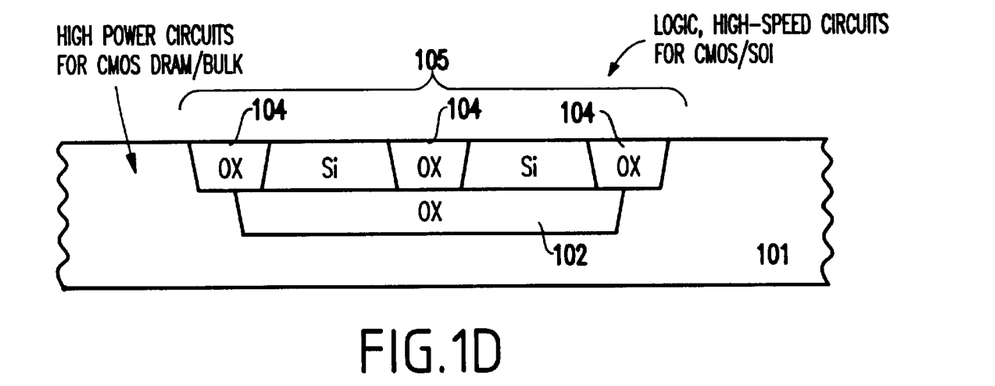

In FIG. 1D, shallow trench isolations (STIs) 104 must be placed at those locations to remove imperfect silicon on crystallized silicon layers to prevent the performance degradation due to imperfect silicon. Also used as local isolation device, those isolation areas can be placed as the CMOS device isolations without any area being wasted.

Figure 1E:
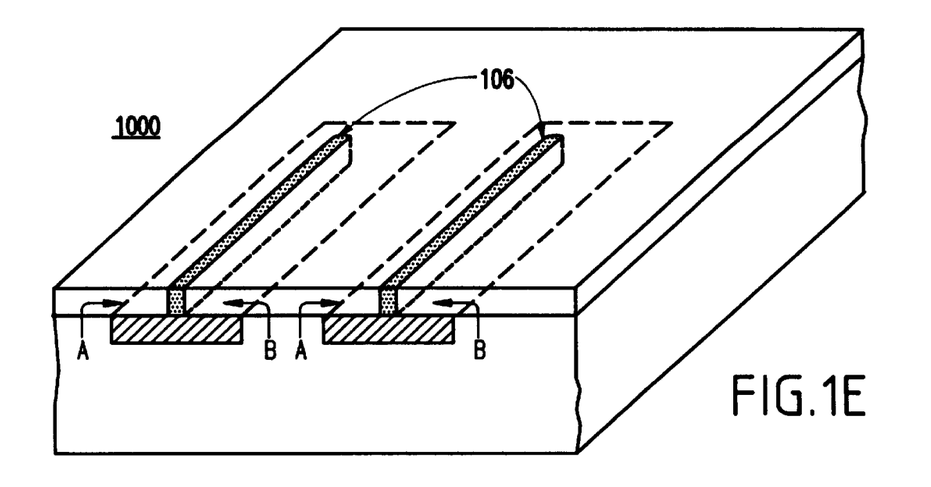
FIG. 1E illustrates a defective region existing in a structure after the crystallization of the silicon on oxide in the first embodiment of the present invention.

In FIG. 1E, a 3-dimensional diagram indicates the location of the defective zone after crystallization which must be removed in a following shallow trench process. After the shallow trench isolation process, the logic devices or high speed circuits are fabricated in the silicon-on-insulator region 105, whereas the memory with deep trench capacitors, or high power circuits which require high efficiency of thermal dissipating, are placed in the bulk area of the wafer.

Referring to FIGS. 2A–2F, an exemplary implementation of the first embodiment of the method of the invention will be described below. Briefly, by using a shallow trench isolation (STI) process and a silicon recrystallization process, a silicon-on-insulator (SOI) can be selectively formed on the patterned wafer substrate.

Figure 2A:
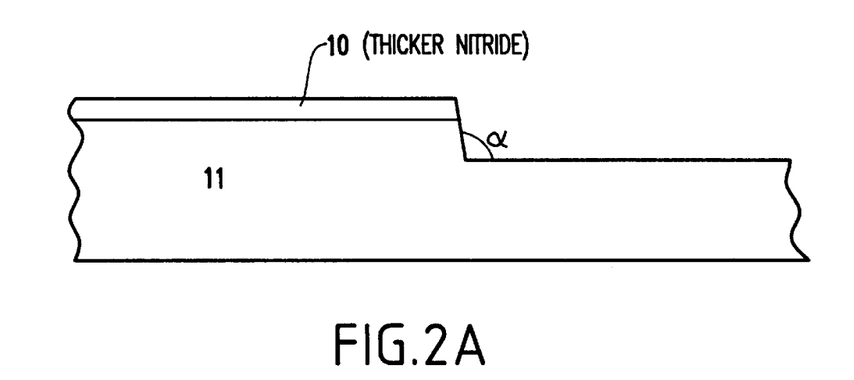
FIGS. 2A–2F illustrate an exemplary implementation of the embodiment of a process of forming the semiconductor device of FIG. 1.

First, in FIG. 2A, a groove is patterned with a nitride mask 10 and etched by well-known methods into a bulk silicon substrate 11. Preferably, the groove has a depth substantially within a typical range of about 1000 Å to about 5000 Å, and more preferably 1500 Å. The groove has a preferred sidewall angle $\alpha$ of approximately 103° to reduce the sharp corner stress.

Figure 2B:
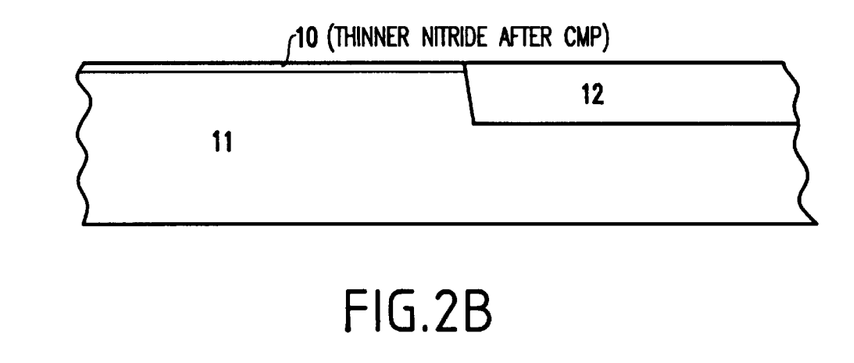

Subsequently, by using a shallow trench oxide fill and a chemical mechanical polishing (CMP) process with nitride mask 10 as a polish stop layer that is commonly used in the silicon processing technology and known by those of ordinary skill in the art, the silicon substrate surface is planarized to form patterned oxide islands 12, as shown in FIG. 2B.

Figure 2C:
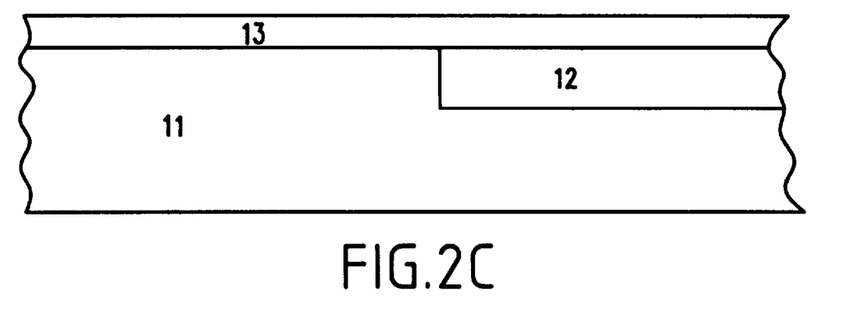

As shown in FIG. 2C, after the mask layer 10 is removed, a layer of poly-crystalline silicon or amorphous silicon 13 is formed (e.g., deposited or grown) on this substrate (e.g., on top of the silicon substrate 11 and the islands 12). If polycrystalline silicon is used, then an amorphousizing implant by high energy ion implant is required to convert the polysilicon into amorphous silicon for a later recrystallization process. Silicon layer 13 preferably has a thickness substantially within a range of about 500 Å to about 3000 Å, and more preferably about 1000 Å.

Figure 2D:
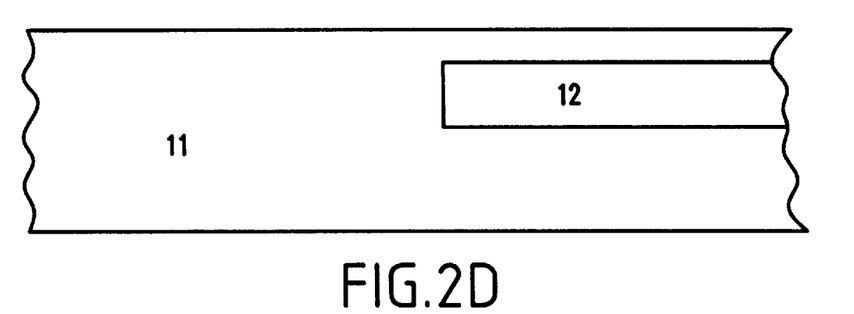

As shown in FIG. 2D, the deposited silicon layer 13 is subsequently crystallized through the utilization of a thermal annealing procedure or other forms of crystallization process, such as laser annealing or thermal annealing process, to make the top layer become crystallized. Known techniques can be used for the thermal annealing process. Further, other processes can be advantageously used.

The bottom single crystal silicon 11 which has direct contact with the deposited silicon film 13 serves as the crystal growth seeding for the crystallization process, and converts the top amorphous silicon 13 to become crystallized silicon 11. Thus, the crystal orientation and structure follow the underlying substrate (e.g., of layer 11).

Figure 2E:
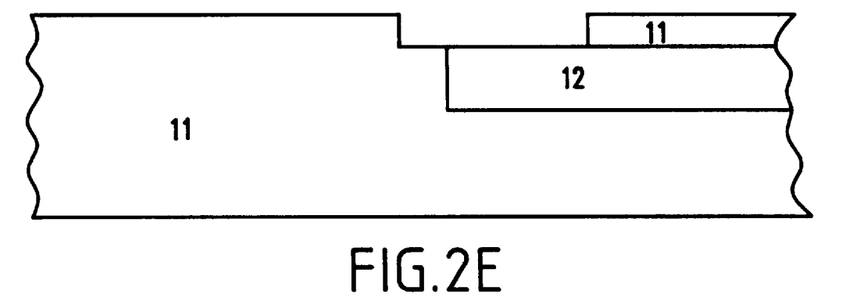
Figure 2F:
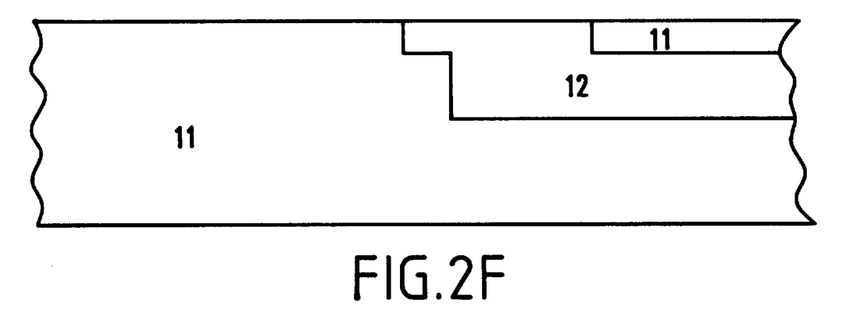

After the crystallization process, a shallow trench isolation (STI) process, as shown in FIGS. 2E–2F, is performed to form the oxide isolations between devices. Briefly, a portion of the silicon layer above the islands 12 is etched with another nitride masking layer (not shown in the drawings) to form a cavity, and then the same material as islands 12 is deposited in the cavity 12A and chemical-mechanical polished to the nitride surface. Thereafter, the upper surface is planarized to complete the oxide isolations.

However, the crystallization of silicon on oxide will not be free of defects. The silicon layer on the oxide islands 12 can have a near ideal crystal structure in this epitaxial process from the seeding single crystal silicon 11 of the bulk silicon nearby. Non-ideal silicon structures exist near the oxide island edges, as well as on the seam where the crystallization of the epitaxial silicon from both edges meet.

For example, as shown in FIGS. 1C and 1E, a structure is shown having a defective region 106. Moreover, an overgrowth direction is shown by arrows A, B in FIG. 1E. This defect region (and its removal) has been described, for example, in several publications where several recrystallization methods are described. The defective region is collected in the middle and may be removed, for example, by reactive ion etching (RIE) or the like. The process of removal defect is done at the same time with one mask when the shallow trench isolations are formed.

Among those processes, a high temperature process (e.g. furnace annealing or scanning the wafer surface with a heating element) or laser irradiation can be used to melt and re-crystallize the silicon on the oxide island 12.

Additionally, as described in "A New Epitaxial Lateral Overgrowth Silicon Bipolar Transistor", G. Neudeck, *IEEE Electron Device Letters*, Vol. EDL-8, No. 10, October 1987, and "Three Dimensional Stacked MOS Transistors by Localized Silicon Epitaxial Overgrowth", Zingg et al., *IEEE Transactions on Electron Devices*, Vol. 37, No. 6, June 1990, other techniques may be selectively employed such as low temperature selective epitaxy and epitaxial lateral overgrowth.

Figure 2G:
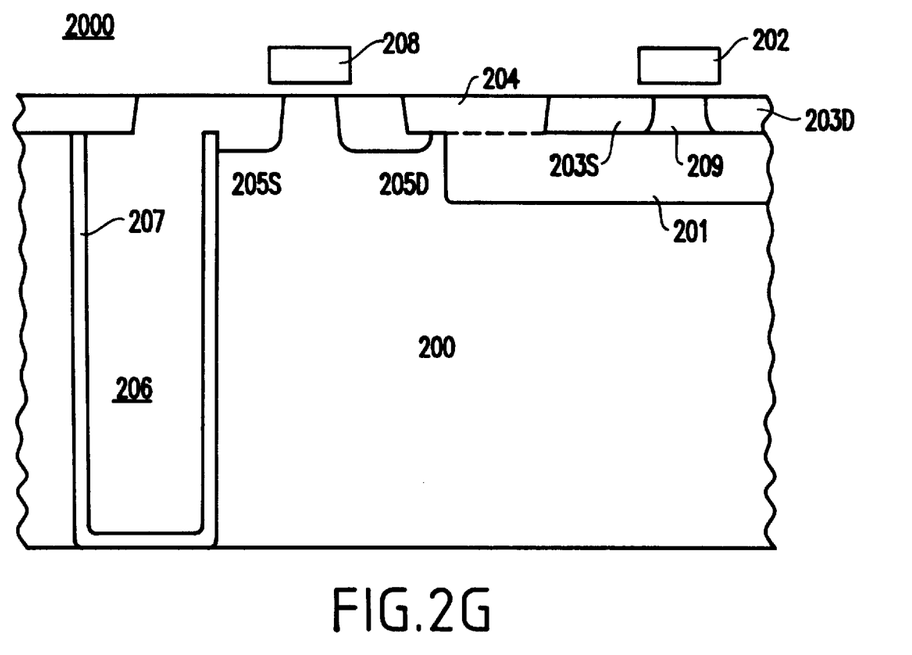
FIG. 2G illustrates a cross-section of an exemplary semiconductor device formed according to the exemplary implementation of FIGS. 2A–2F (that is, a deep trench DRAM cell is in the bulk and a peripheral device(s) is on the SOI)

FIG. 2G illustrates a cross-section of an exemplary fabricated semiconductor device 2000 according to the method of the present invention shown in FIGS. 1A–1D.

The semiconductor structure 2000 includes a bulk silicon substrate 200 together with an isolation oxide 204, a buried oxide 201 for the SOI substrate with a metal oxide semiconductor field effect transistor (MOSFET) device, which forms the source/drain 203S, 203D, a channel 209, a gate 202, and also a bulk MOSFET device for the DRAM, which includes the source/drain 205S, 205D, a gate 208 and a deep trench storage capacitor 206, built on the bulk substrate 200. The deep trench capacitor 206 has a node dielectric 207. The processing details are described above, with regard to FIGS. 1A–1E.

Figure 3:
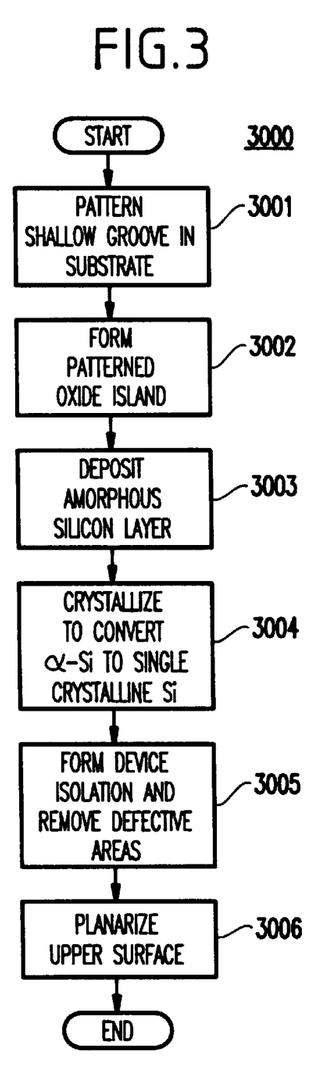
FIG. 3 illustrates a flowchart of the method according to the first embodiment of the present invention.

FIG. 3 illustrates a flowchart 3000 of the above-described process according to the first embodiment of the application. Specifically, in step 3001, the groove is patterned and etched into the bulk silicon substrate.

In step 3002, the silicon substrate surface is planarized, by using a shallow groove oxide fill and a chemical mechanical polishing (CMP) process, to form patterned oxide islands.

In step 3003, a layer of amorphous silicon is formed (e.g., deposited) on the substrate (e.g., on top of the silicon substrate and the islands).

In step 3004, the formed (deposited) silicon layer 13 is subsequently crystallized through the utilization of a thermal annealing procedure or other forms of crystallization process, such as laser annealing or thermal annealing process, to make the top layer become crystallized.

In step 3005, after the crystallization process, a shallow trench isolation (STI) process is performed to form the oxide isolations between devices. Such a process may include etching a portion of the silicon layer including high defect density zones above the islands to form a cavity, and then the same material as islands is deposited in the cavity.

In step 3006, the upper surface is planarized to complete the oxide isolations.

Thus, with the method and structure of the first embodiment, a semiconductor structure can be built having merged DRAM and logic technology on a single substrate.

Second Embodiment

Referring to FIGS. 4A–4D, a method according to a second embodiment of the present invention will be described. A difference between the second embodiment is not planarized as in the first embodiment, and thus is not believed to be as preferred as the first embodiment. However, processing costs are reduced with the second embodiment.

Figure 4A:
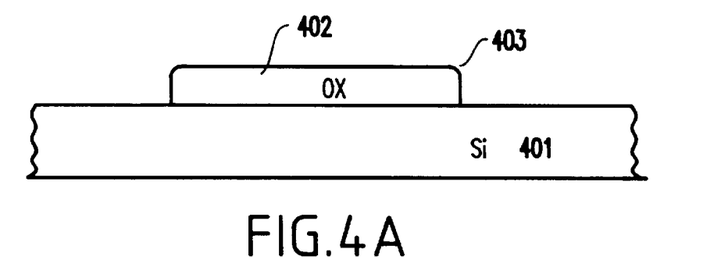
FIGS. 4A–4D illustrate a second embodiment of the method of forming a semiconductor substrate according to the present invention.

In FIG. 4A, a dielectric (e.g. oxide, nitride) 402 is deposited to a thickness of about 500 Å to about 3000 Å, and more preferably to about 1000 Å. Then, the dielectric 402 is patterned through a dry etch or the like. The corner of the patterned dielectric is rounded by dipping in a buffered hydrofluoric (BHF) solution. The rounded corner of the dielectric layer will improve the silicon quality later in the subsequent lateral over-grown epitaxial process.

Figure 4B:
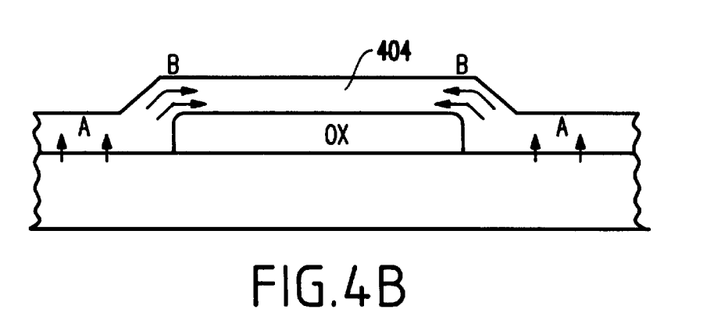

As shown in FIG. 4B, an epitaxial lateral over growth is performed in a manner known in the art. Arrow A shows the vertical growth and arrows B illustrate the horizontal epitaxial growth direction.

Figure 4C:
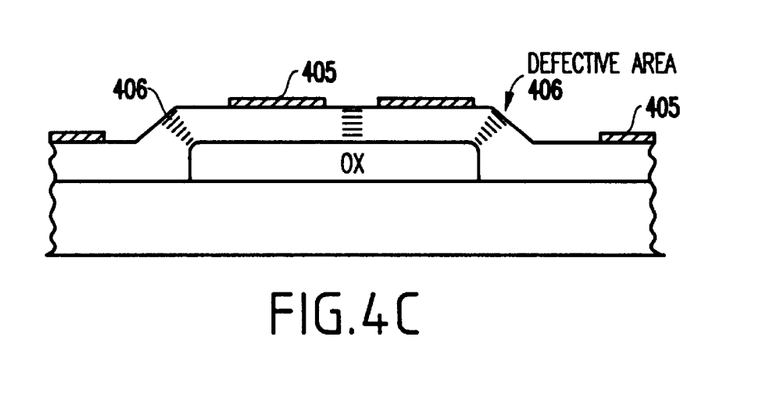

As shown in FIG. 4C, a pattern isolation operation is performed with a thin masking level, e.g., nitride 405, to form an isolation while removing the defective area 406.

Figure 4D:
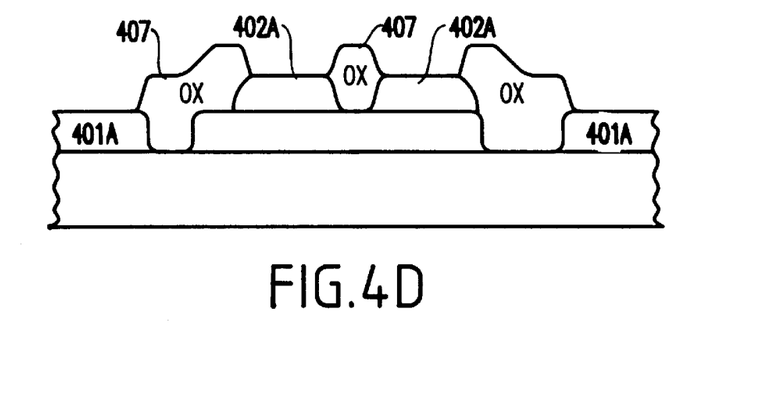

As shown in FIG. 4D, a thermal oxide is grown to consume the silicon in the exposed area 407. The remaining silicon area 402A forms the SOI structure, and the remaining area 401A forms the bulk structure.

Figure 5:
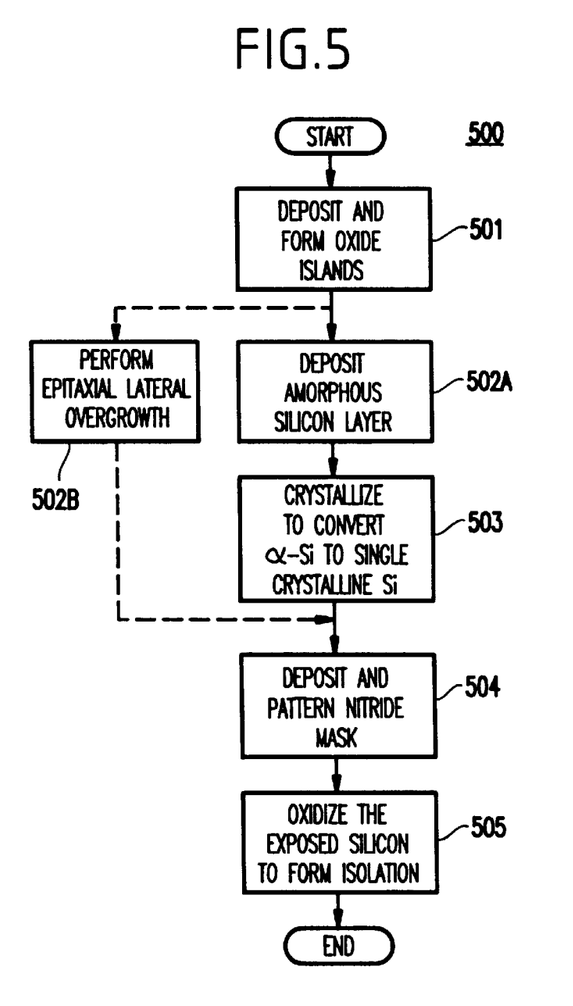
FIG. 5 illustrates a flowchart of the method 500 according to the second embodiment of the present invention.

FIG. 5 illustrates a flowchart of the above method 500 shown in FIGS. 4A–4D of the invention and which can be applied to form a mixed bulk and SOI CMOS device.

Specifically, in step 501, the buried oxide layer is processed on the single crystal silicon substrate by depositing a dielectric and patterning it in the silicon substrate.

Thereafter, in step 502A, the amorphous silicon layer is formed (e.g., deposited) over the oxide and the silicon wafer surface.

In step 503, the amorphous silicon layer is converted to single crystalline silicon by an annealing process. An alternative method is through step 502B, as shown in FIG. 5, by an epitaxial lateral overgrowth process in which a single crystal silicon can be formed on top of the dielectric film by lateral overgrowth from the exposed Si substrate.

In step 504, the silicon surface is patterned with a nitride mask, and in step 505 the exposed silicon surfaces are oxidized including those locations to remove imperfect silicon on insulator layers to prevent the performance degradation due to imperfect silicon.

The logic device are fabricated in the silicon-on-insulator region, to complete the process.

Figure 6A:
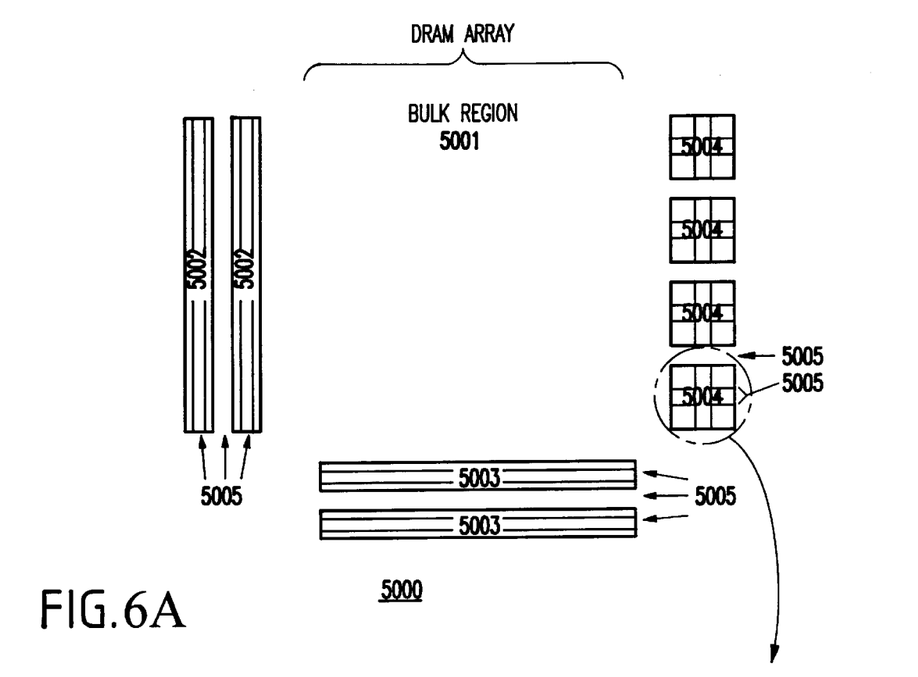
FIGS. 6A–6B illustrate a layout of a semiconductor chip 5000 in which the DRAM array is on a bulk silicon area of the chip, whereas logic devices are formed on SOI areas of the chip.
Figure 6B:
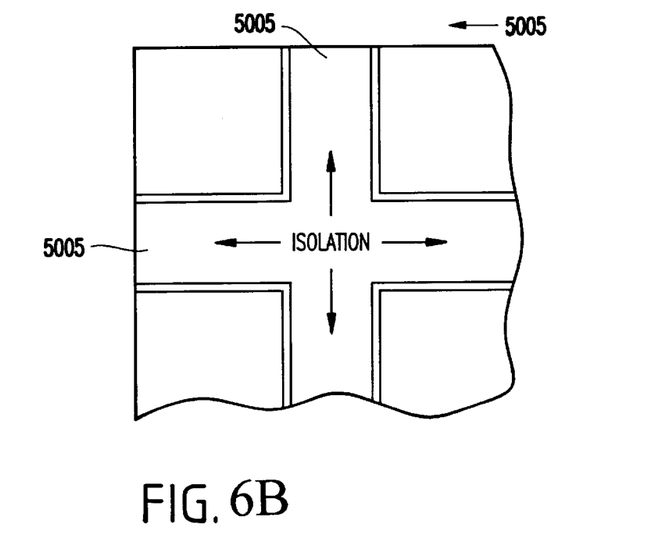

In terms of the layout arrangement using DRAM memory array as an example, a memory array device (as shown in FIGS. 6A and 6B), is placed in the bulk silicon region 5001. While the logic devices require using SOI, structures are placed in the strips of SOI islands 5002, 5003, 5004 which are isolated by the shallow trench isolation regions 5002. The logic devices may, for example, be P-FET and N-FET devices. In an exemplary layout, in region 5002 may be located a row decoder and word line driver circuits, etc. In region 5003, a column decoder circuit, a sense-amplifier circuit, etc. may be positioned, wherein an input/output (I/O) circuit, etc. may be located in region 5004.

With the present invention, a process of fabricating a patterned SOI substrate is provided. The technique can be used for mixed bulk and SOI devices where mixed applications (e.g. merged logic and DRAM CMOS technology), as well as some other technologies where several different kinds of devices must be merged together on the same chip (e.g., mixed signal processing circuitry), digital and analog CMOS using different power supply voltages are required, and high voltage devices where devices with a higher power supply voltage (e.g., from about 3V to about 15V) are used.

In the present invention, shallow trench isolations serve both as the isolation between devices and also to remove the crystallization defect. This is a key feature of the invention and provides many advantages. Thus, high performance logic circuits (e.g., low voltage, low power circuits having a voltage of, for example, about 1V or less, or higher performance digital circuits operating at, for example, above about 300 MHz clock rate) can be fabricated on the SOI substrate together with other devices such as an analog circuit, a memory array, high power circuits (e.g., from about 3V to about 15V), etc. (e.g., DRAM, DRAM, EEPROM, flash-ROM, F-RAM, etc.) which require the bulk silicon substrate.

Indeed, according to the present invention, a method and structure are provided which produce a patterned SOI substrate where DRAM devices can be built on the bulk substrate while the logic devices (as well as the peripheral devices for the DRAMs) are built on the patterned SOI substrate.

With the unique and unobvious features of the invention, dynamic random access memory (DRAM) and logic technology can be efficiently merged to fabricate an entire system on a semiconductor chip such that memory latency is reduced, bandwidth is increased, and high-speed processing, cost reduction, and better thermal dissipation result.

While the invention has been described in terms of several preferred embodiments, those skilled in the art will recognize that the invention can be practiced with modification within the spirit and scope of the appended claims.

For example, the invention could be modified to implement a SiGe epitaxial process to form islands with SiGe, or other III–V compounds, to mix silicon with other semiconductor or conductive materials on an insulator.

What is claimed is:

1. A method of forming a semiconductor substrate, comprising:
    etching a groove into a bulk silicon substrate;
    forming a dielectric in said groove and planarizing said balk silicon substrate to form at least one patterned dielectric island in said bulk silicon substrate;
    forming an amorphous silicon layer on exposed portions of said bulk silicon substrate and said at least one dielectric island;
    crystallizing said amorphous silicon layer, to form a crystallized silicon layer, using the exposed portions of said bulk silicon substrate as a seed, said balk silicon substrate having direct contact with the amorphous silicon layer serving as a crystal growth seeding for the crystallization process, and converting the amorphous silicon layer to crystallized silicon layer; and
    performing a shallow trench isolation (STI) process, to form oxide isolations between devices.

2. The method according to claim 1, wherein defects in a defect zone in said crystallized silicon layer are removed by replacing said defects with dielectric in said STI process.

3. The method according to claim 2, wherein circuits are arranged such that defect zones in said crystallized silicon layer are used as an isolation area.

4. The method according to claim 2, wherein said performing said STI process includes using a mask, and
    wherein said mask used for said STI process is designed such that defect zones in said crystallized silicon layer are converted to said oxide isolations.

5. The method according to claim 1, wherein said amorphous silicon layer comprises polycrystalline silicon or microcrystalline silicon and rendered amorphous by an inert ion implantation.

6. The method according to claim 1, wherein said crystallizing comprises crystallizing through an annealing process.

7. The method according to claim 6, wherein said annealing process comprises a laser beam annealing process.

8. The method according to claim 6, wherein said annealing process comprises an ion beam annealing process.

9. The method according to claim 1, wherein said crystallized silicon layer has a crystal orientation and structure which follow those of the bulk silicon substrate.

10. A method of forming a substrate for mixed logic and memory applications, comprising:
    forming a buried oxide layer on a single crystal silicon substrate;
    performing a silicon epitaxial lateral overgrowth process using an exposed area of the single crystal silicon substrate for crystallization seeding, to form a single crystal silicon on top of said buried oxide layer by lateral overgrowth from the exposed area of the single crystal silicon substrate; and
    forming shallow trench isolations (STIs) at locations to remove silicon on said buried oxide layer.

11. A method of forming a substrate for mixed logic and memory applications, comprising:
    forming a buried oxide layer on a single crystal silicon substrate;
    forming an amorphous silicon layer over the buried oxide layer and said single crystal silicon substrate;
    annealing said amorphous silicon layer and converting said amorphous layer to a single crystalline silicon; and
    forming shallow trench isolations (STIs) at locations to remove silicon on said buried oxide layer.

12. The method according to claim 11, wherein said single crystal silicon substrate has a mixed bulk region and a silicon-on-insulator (SOI) region, said method further comprising:
    fabricating a logic device in the silicon-on-insulator (SOI) region.

13. The method according to claim 12, wherein said bulk region includes at least one of a memory array, a dynamic random access memory (DRAM), a static random access memory (SRAM), a flash memory, a high voltage, high power circuit, and an analog circuit.

14. The method according to claim 11, wherein said substrate has a mixed bulk region and a silicon-on-insulator (SOI) region, said method further comprising:
    fabricating a memory device in the bulk silicon region.

15. The method according to claim 14, wherein said SOI region includes at least one of logic circuit, a low voltage, low power circuit, and a high performance digital circuit operating at a clock rate.

16. The method according to claim 11, wherein said forming said buried oxide layer comprises forming a groove in the single crystal silicon substrate, and filling said groove with oxide.

17. The method according to claim 11, wherein logic devices are placed in strips of silicon-on-insulator (SOI) islands which are isolated by regions formed by the shallow trench isolation (STI) process.

18. The method according to claim 11, wherein noise-sensitive circuits are placed in strips of silicon-on-insulator (SOI) islands which are isolated by regions formed by the shallow trench isolation (STI) process.

19. The method according to claim 17, wherein said logic devices comprise P-FET and N-FET devices.

20. The method according to claim 11, wherein said single crystal silicon substrate includes a bulk region, and
    wherein thermal-sensitive circuits are placed in the bulk region such that temperature control is maximized.

21. A method of forming a substrate for mixed memory and logic applications, comprising:
    forming a dielectric on a substrate;
    performing an epitaxial lateral overgrowth process over the dielectric;
    performing a pattern isolation operation, to form an isolation while removing a defective area; and forming a thermal oxide to consume silicon in an exposed area, such that a first remaining area forms a silicon-on-insulator (SOI) structure, and a second remaining area forms a bulk structure.

22. The method according to claim 21, wherein said dielectric has a thickness in a range of about 500 Å to about 3000 Å, and is patterned through a dry etch, and wherein a corner of the patterned dielectric is rounded.

23. A method of forming a structure for mixed memory and logic applications, comprising:

processing a buried dielectric layer on a single crystal silicon substrate by depositing a dielectric and patterning said dielectric in said single crystal silicon substrate;

forming an amorphous silicon layer over the dielectric layer and a surface of the single crystal silicon substrate;

converting said amorphous silicon layer to a single crystalline silicon layer by an annealing process;

patterning a surface of the single crystalline silicon with a nitride mask such that the single crystalline silicon layer has masked portions and exposed silicon portions; and oxidizing aid exposed silicon portions including locations to remove any desired silicon of the single crystalline silicon layer.

* * * * *